United States Patent
He et al.

(10) Patent No.: US 7,283,398 B1
(45) Date of Patent: Oct. 16, 2007

(54) METHOD FOR MINIMIZING FALSE DETECTION OF STATES IN FLASH MEMORY DEVICES

(75) Inventors: Yue-Song He, San Jose, CA (US);
Richard Fastow, Cupertino, CA (US);
Takao Akaogi, Cupertino, CA (US);
Wing Leung, Palo Alto, CA (US);
Zhigang Wang, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 194 days.

(21) Appl. No.: 10/838,962

(22) Filed: May 4, 2004

(51) Int. Cl.
*G11C 16/06* (2006.01)
(52) U.S. Cl. .................. 365/185.22; 365/185.23; 365/185.02; 365/185.18
(58) Field of Classification Search .......... 365/185.22, 365/185.23, 185.02, 185.18
See application file for complete search history.

(56) References Cited

U.S. PATENT DOCUMENTS

| | | | | |
|---|---|---|---|---|
| 5,943,262 A * | 8/1999 | Choi | ..................... | 365/185.17 |
| 6,055,190 A * | 4/2000 | Lu et al. | ................. | 365/185.22 |
| 6,172,917 B1 * | 1/2001 | Kataoka et al. | ........ | 365/185.22 |
| 6,285,593 B1 * | 9/2001 | Wong | .................... | 365/185.23 |
| 6,333,662 B1 * | 12/2001 | Umezawa et al. | ..... | 365/230.06 |
| 6,356,481 B1 * | 3/2002 | Micheloni et al. | ..... | 365/185.23 |
| 6,975,538 B2 * | 12/2005 | Abedifard et al. | ..... | 365/185.19 |

* cited by examiner

Primary Examiner—Huan Hoang

(57) ABSTRACT

The present invention provides a method for determining program and erase states in flash memory devices. Specifically, one embodiment of the present invention discloses a method for minimizing false detection of states in an array of non-volatile floating gate memory cells. A plurality of word lines are arranged in a plurality of rows. A plurality of bit lines are arranged in a plurality of columns. The method begins by determining a selected bit line that is associated with a column of memory cells. Then, the method continues by biasing a group of word lines at a negative voltage. The group of word lines are electrically coupled to the associated memory cells. The application of negative voltage to the group of word lines limits leakage current contributions from the associated memory cells in the column of memory cells when performing a verify operation.

17 Claims, 4 Drawing Sheets

METHOD FOR MINIMIZING FALSE DETECTION OF STATES IN FLASH MEMORY DEVICES

TECHNICAL FIELD

The present invention relates to the field of microelectronic integrated circuits. Specifically, the present invention relates to mirror bit flash memory devices.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for nonvolatile data storage.

A typical configuration of a flash memory cell consists of a thin, high-quality tunnel oxide layer sandwiched between a conducting polysilicon floating gate and a crystalline silicon semiconductor substrate. The tunnel oxide layer is typically composed of silicon oxide ($Si_xO_y$). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

A typical configuration of an array of flash memory cells includes rows and columns of flash memory cells. The array is supported by word lines and bit lines, wherein the word lines are coupled to gates of flash memory cells, and the bit lines are coupled to drains. The sources of the flash memory cells are commonly coupled together.

The flash memory cell stores data by holding charge within the floating gate. In a write or program operation, charge can be placed on the floating gate through hot electron injection, or Fowler-Nordheim (F-N) tunneling. In addition, F-N tunneling can be typically used for erasing the flash memory cell through the removal of charge on the floating gate.

A common failure in flash memory is a programming failure due to an over-erased cell. During an erase process, not all bits in an array erase in the same way. Typically, threshold voltages for an array of flash memory that have been erased fall within a Gaussian distribution. A reference voltage, and its corresponding current, provide a means to determine whether a memory cell has been erased. Threshold voltages of memory cells below the reference voltage indicate that those memory cells are erased.

When a column of flash memory cells, in an array of flash memory cells, is erased in parallel, some memory cells are erased very quickly (fast bits) while other memory cells are harder to erase (slow bits). A small percentage of over-erased bits having threshold voltages below 0 volts can occur. The fast bits create a non-Gaussian distribution of threshold voltages, which leads to a wider distribution of threshold voltages.

Unfortunately, having an over-erased cell on the same column line with a selected memory cell, or bit, can cause a failure when the selected memory cell is read during a verify operation, such as a erase verify operation. The over-erased cell produces a leakage current and causes the entire column to malfunction. As a result, the state of the selected memory cell may be falsely reported. For example, in an erase verify operation, the selected memory cell may be falsely verified to be erased, when in fact, the selected memory cell is still programmed. Specifically, in an erase verify operation, when determining that the selected memory cell is still programmed, the current that is read from the column should be below the reference current ($I_{Ref}$) that corresponds to the reference threshold voltage. This corresponds to an improperly erased cell having a higher threshold voltage and producing a current below $I_{Ref}$, where $I_{Ref}$ is the erased cell reference current used for comparison.

However, if an over-erased cell is in the same column as that of the selected memory cell that is still programmed even after an array wide erase operation, the over-erased cell has a threshold voltage that is less than 0 and produces a leakage current ($I_{Leak}$). As such, the total current read from the column will include the current from the selected memory cell ($I_{Program}$) and the leakage current. If the sum of $I_{Program}+I_{Leakage}>I_{Ref}$, then the total current being read from the column is greater than the reference current, and the programmed cell appears to be erased, when in fact it is still improperly programmed.

What is needed is a method for detecting the proper states of flash memory cells.

DISCLOSURE OF THE INVENTION

The present invention provides a method for determining program and erase states in flash memory devices. Specifically, one embodiment of the present invention discloses a method for minimizing false detection of states in an array of non-volatile floating gate memory cells. A plurality of word lines are arranged in a plurality of rows. A plurality of bit lines are arranged in a plurality of columns. Each of the memory cells comprises a source, a control gate coupled to a respective word line, and a drain coupled to a respective bit line, and is capable of storing at last one bit. The method begins by determining a selected bit line that is associated with a column of memory cells. Then, the method continues by biasing a group of word lines at a negative voltage. The group of word lines are electrically coupled to the associated memory cells. The application of negative voltage to the group of word lines limits leakage current contributions from the associated memory cells in the column of memory cells when performing a verify operation.

BEST MODES FOR CARRYING OUT THE INVENTION

Reference will now be made in detail to the preferred embodiments of the present invention, a method for determining the proper state of a memory cell in an array of non-volatile memory cells. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention discloses a method for minimizing the effect of leakage current when determining states of a memory cell in an array of memory cells. More specifically, embodiments of the present invention are capable of greatly reducing false verifications of states during verify operations. As a result, embodiments of the present invention are more reliable than conventional erase processes by reducing the effect of leakage current when determining states of memory cells in a column of memory cells. Specifically, embodiments of the present invention significantly reduce the effects of overerasure and subthreshold degradation in non-volatile memory cells.

Figure 1:
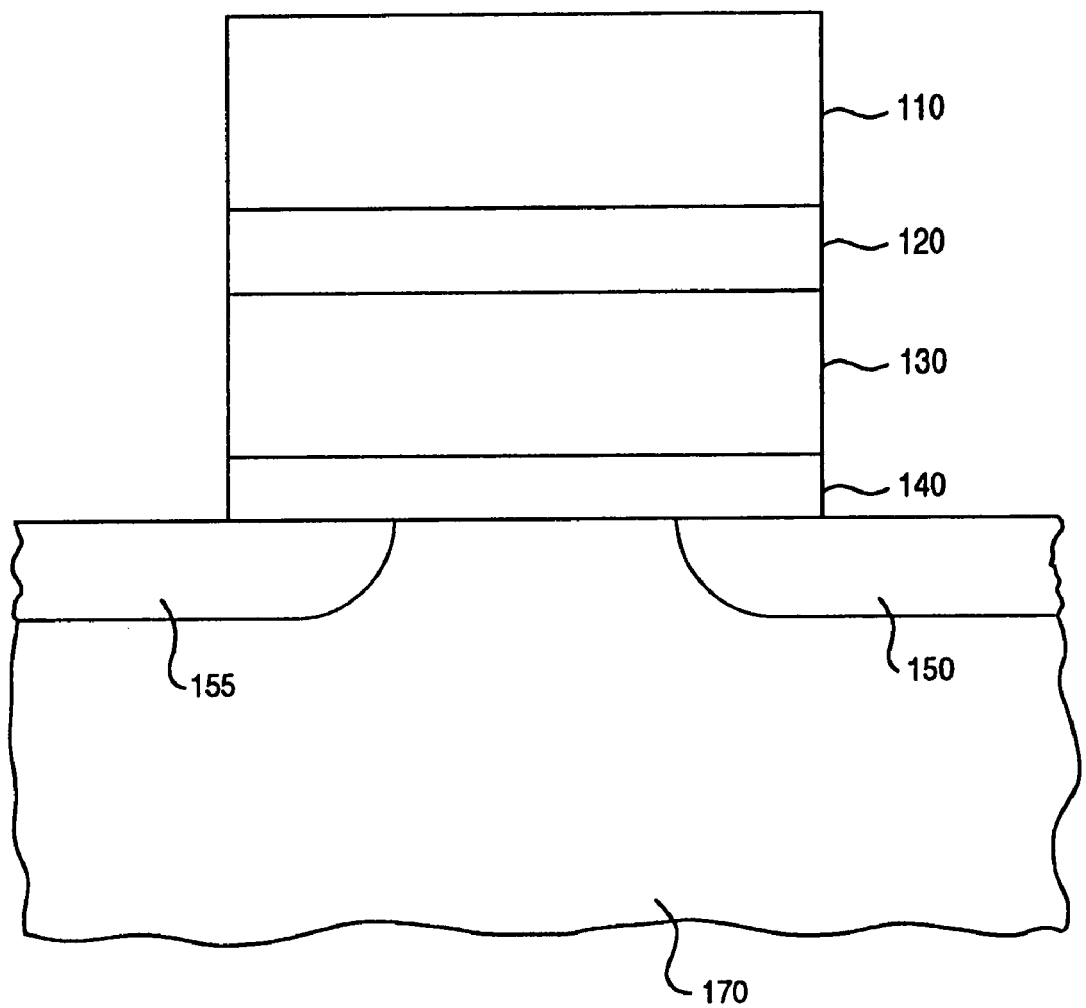
FIG. 1 is a diagram of a non-volatile flash memory cell, in accordance with one embodiment of the present invention.

Referring now to FIG. 1, a typical configuration of a floating gate memory cell 100, that is a flash memory cell, for implementation within the array of memory cells is shown, in accordance with one embodiment of the present invention. The memory cell 100 consists of a thin, high-quality tunnel oxide layer 140 sandwiched between a conducting polysilicon floating gate 130 and a crystalline silicon semiconductor substrate 170. The tunnel oxide layer 140 is typically composed of silicon oxide ($Si_xO_y$). The substrate 170 includes a source region 150 and a drain region 155 that are separated by an underlying channel region. A control gate 110 is provided adjacent to the floating gate 130, and is separated by an interpoly dielectric 120. Typically, the interpoly dielectric 120 can be composed of an oxide-nitride-oxide (ONO) structure.

While embodiments of the present invention are discussed within the context of the flash memory cell as described in FIG. 1, other embodiments of the present invention are well suited to arrays of memory cells suitable for and supporting a wide range of flash memory cells, including dual bit flash memory cells.

Figure 2:
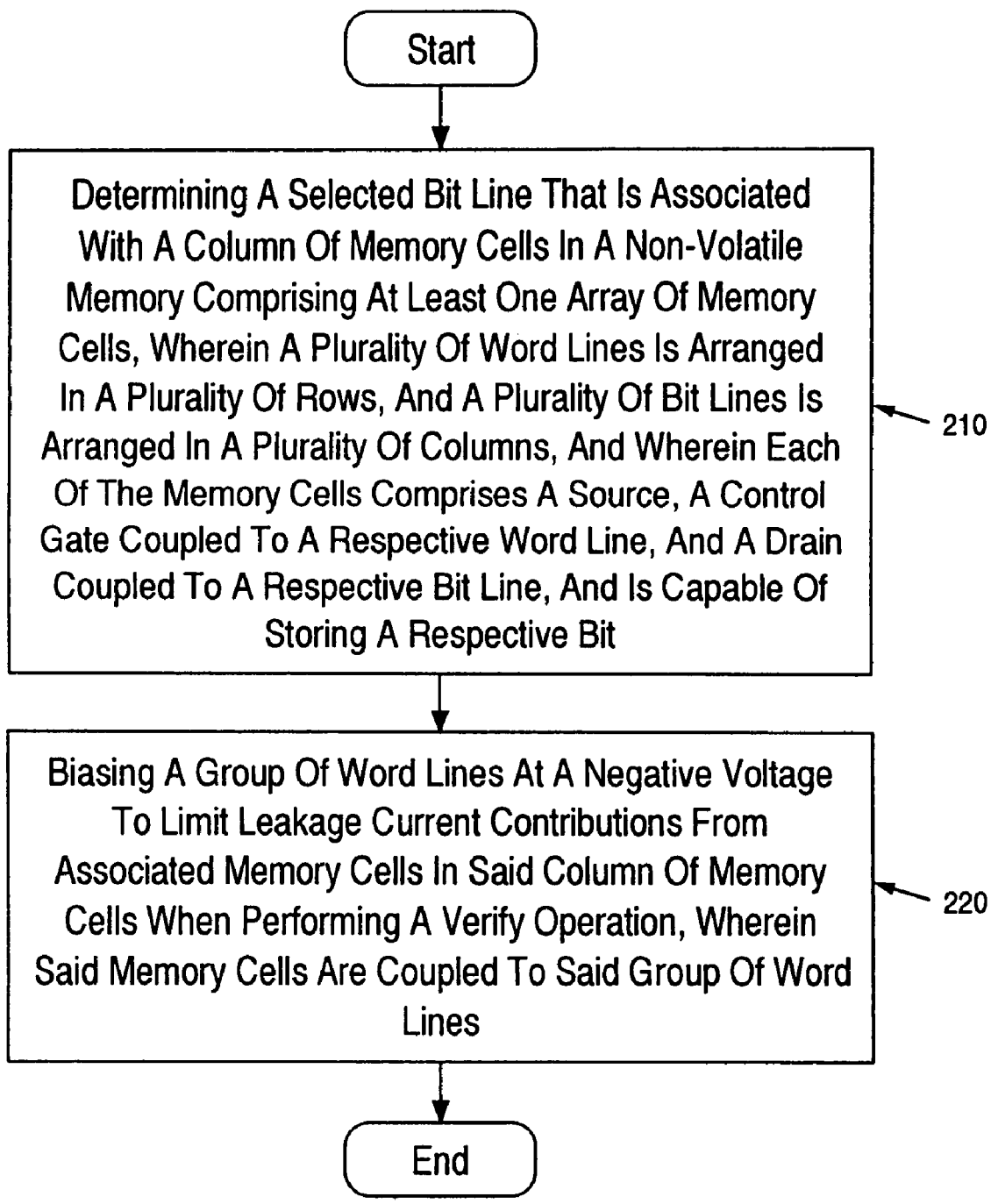
FIG. 2 is a flow chart illustrating steps in a method for minimizing the effect of leakage current when determining states of a memory cell in an array of memory cells, in accordance with one embodiment of the present invention.

FIG. 2 is a flow chart 200 illustrating steps in a method for minimizing leakage current when detecting states of memory cells in a non volatile memory, in accordance with one embodiment of the present invention. The non-volatile memory comprises at least one array of memory cells. The array of memory cells is arranged in a plurality of word lines that are configured in a plurality of rows. In addition, the array comprises a plurality of bit lines configured in a plurality of columns.

Each of the memory cells in the array of memory cells comprises a source, a control gate that is coupled to a respective word line, and a drain that is coupled to a respective bit line. Each of the memory cells is capable of storing at least one respective bit.

The present embodiment begins by determining a selected bit line in the array of memory cells, at 210. The selected bit line is associated with a column of memory cells. Current is read from the selected bit line to verify states of one or more memory cells in the associated column of memory cells.

At 220, the present embodiment biases a group of word lines at a negative voltage. The group of word lines is selected from the plurality of word lines in the array of memory cells. As such, the group of word lines may comprise all of the word lines in the plurality of word lines, or the group of word lines may comprise all but a selected word line that is associated with a selected memory cell in the column of memory cells. The application of a negative voltage limits leakage current contributions from associated memory cells in the column of memory cells when performing a verify operation. The memory cells are electrically coupled to the group of word lines.

In the present embodiment, the negative voltage is selected from a voltage between negative 0.5 volts (−0.5 volts) to negative 2 volts (−2.0 volts). In one embodiment, the negative voltage that is applied comprises negative 1 volt (−1.0 volt). The application of negative voltage on the group of word lines produces minimal current in associated memory cells in the column of memory cells. It is believed that the current in a memory cell is proportional to the voltage on the gate, as transmitted through an associated word line. That is, as the voltage on the gate decreases below 0 volts, the current through the memory cell will significantly abate to zero volts. It is believed that the leakage current drops by approximately a factor of 10 as the gate voltage drops from 0 volts to −1.0 volts. As such, even for those over-erased memory cells that conduct significant leakage current when 0 volts is applied to the gate, after biasing the gate negatively, the leakage current is significantly reduced. As a result, the effect of leakage currents from over-erased memory cells is significantly reduced during verify operations.

The verify operation is performed to determine the proper state of selected memory cells in the column of memory cells. For example, in an erase verify operation, a state of a selected memory cell in the column of memory cells is determined to verify if the selected memory cell has been properly erased, as will be described in full below. Also, in an automatic program disturb after erase (APDE) verify operation, the column of memory cells is tested to verify if threshold voltages of the memory cells in the column have been properly adjusted, as will be described in full below. Additionally, in a program verify operation, a selected memory cell in the column of memory cell is tested to determine if the selected memory cell has been properly programmed, as will be described more fully below.

Figure 3:
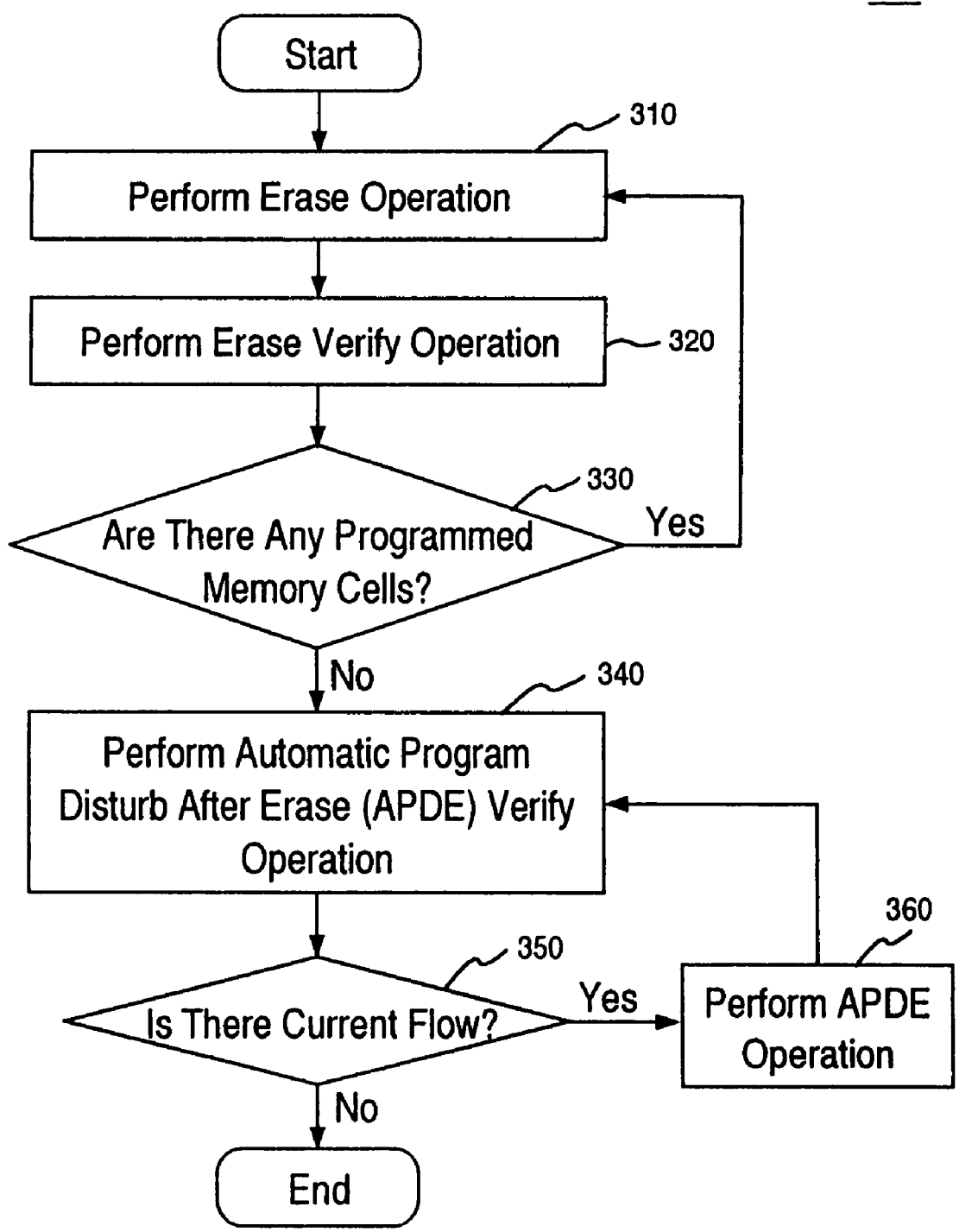
FIG. 3 is a flow chart illustrating steps in a method for minimizing the effect of leakage current when performing an erase verify operation, in accordance with one embodiment of the present invention.

FIG. 3 is a flow chart 300 illustrating steps in a method for minimizing the effect of leakage current when determining states of a memory cell during an erase verify operation, in accordance with one embodiment of the present invention. The present embodiment is performed on a selected memory cell that is associated with a column of memory cells in a non-volatile memory. The non-volatile memory comprises at least one array of memory cells, wherein the array comprises a plurality of word lines arranged in a plurality of rows, and a plurality of bit lines arranged in a plurality of columns. Each of the memory cells comprises a source, a control gate coupled to a respective word line, and a drain coupled to a respective bit line, and is capable of storing a respective bit.

At 310, the present embodiment performs an array wide erase operation. in a typical erase operation, the array is erased one sector at a time. The sector is a group of column and rows, typically 512 kilobits. The erase operation is well known in the art.

At 320, the present embodiment performs an erase verify operation. The erase verify operation is performed one bit at a time. That is, the erase verify operation is performed on each of the memory cells in the sector that is erased to determine if the erase operation was successful.

During the erase verify operation, the present embodiment determines a selected memory cell in a column of memory cells in the array of memory cells. The selected memory cell is associated with a selected word line and a selected bit line. In part, by applying the appropriate voltages to the selected word line and the selected bit line, the selected memory cell is isolated to perform a read or write (program) operation.

In the present embodiment, current associated with the selected memory cell is read to determine the threshold voltage of the selected memory cell. In that way, the present embodiment can determine if the selected memory cell was properly erased. The current is read from the associated column of memory cells.

To minimize the contribution of leakage current from unselected memory cells in the associated column, the present embodiment biases the unselected word lines at a negative voltage when performing an erase verify operation on said selected memory cell. As described previously, the negative voltage is selected from a range between −0.5 volts to −2.0 volts.

The present embodiment is able to greatly reduce or eliminate false erase verify reports during the erase verify operation. That is, because the leakage current from unselected memory cells in a column of memory cells is reduced, the contribution of leakage current to the current read from the associated bit line can be ignored. As such, the current read from the bit line is primarily from the selected memory cell. As a result, the state of the selected memory cell can be determined. For example, if the selected memory cell is properly programmed, the current from the selected memory cell will be below a reference current. Leakage current from unselected memory cells in the column can contribute to the current read from the associated bit line giving a false reading that indicates that the selected memory cell is erased or over-erased. However, because the leakage current can be ignored, the current from the bit line will be contributed solely from the selected memory cell, and will also be below the reference current thereby giving a proper program reading for the selected memory cell. As such, the present embodiment is able to greatly reduce or eliminate false erase verify readings.

In addition, when performing the erase verify operation, the present embodiment biases the selected word line at approximately 3 volts. Also, the selected bit line is biased at approximately 0.65 volt. The remaining bit lines are floated, or biased to ground. In addition, the sources associated with the memory cells in the column of memory cells are floated or biased to ground.

At 330, the present embodiment determines if all the memory cells in the array of memory cells have been properly erased. That is, when performing the erase verify operation on each of the memory cells in the array, if the present embodiment determines that any memory cells fail the erase verify operation, indicating that they were not properly erased, and are still programmed, then the flow chart 300 returns to 310 and performs another array wide erase operation. The present embodiment performs the operations in 310 and 320 until all memory cells in the array of memory cells are erased and pass the erase verify operation.

On the other hand, if the present embodiment determines that all the memory cells in the array of memory cells have been properly erased, and that each of the memory cells in the array pass the erase verify operation, then the present embodiment performs an APDE verify operation, at 340. That is, the present embodiment determines if there are any over-erased cells throughout the array of memory cells.

The APDE verify operation is performed on the array of memory cells as a whole. During the APDE verify operation, the present embodiment biases all the word lines in the plurality of word lines in the array of the memory cells at a negative voltage. In addition, the present embodiment biases a selected bit line at approximately 0.65 volts, floats or biases to ground the remaining bit lines, and floats or biases to ground the sources of the memory cells in the selected bit line.

The negative voltage is described previously as being selected from −0.5 volts to −2.0 volts. In this way, all the memory cells in the array should not conduct current, if their threshold voltages are properly configured. That is, no current should be read from each of the bit lines in the array of memory cells.

However, if a memory cell in the array of memory cells is over-erased, the over-erased cell will conduct current during the APDE verify operation. As such, if current flow is detected in the selected bit line at decision step 350, the present embodiment proceeds to 360 and performs an APDE operation on the array of memory cells. The APDE operation is well known in the art. After performing the APDE operation in 360, the present embodiment proceeds back to 340 to perform the APDE verify operation on the array of memory cells. The present embodiment performs the operations in 340, 350, and 360 until all the memory cells in the array are properly erased.

On the other hand, if no current flow is detected in the selected bit line at decision step 350, the present embodiment ends. As such, the distribution of threshold voltages for erased memory cells in the in the array of memory cells is properly configured.

Figure 4:
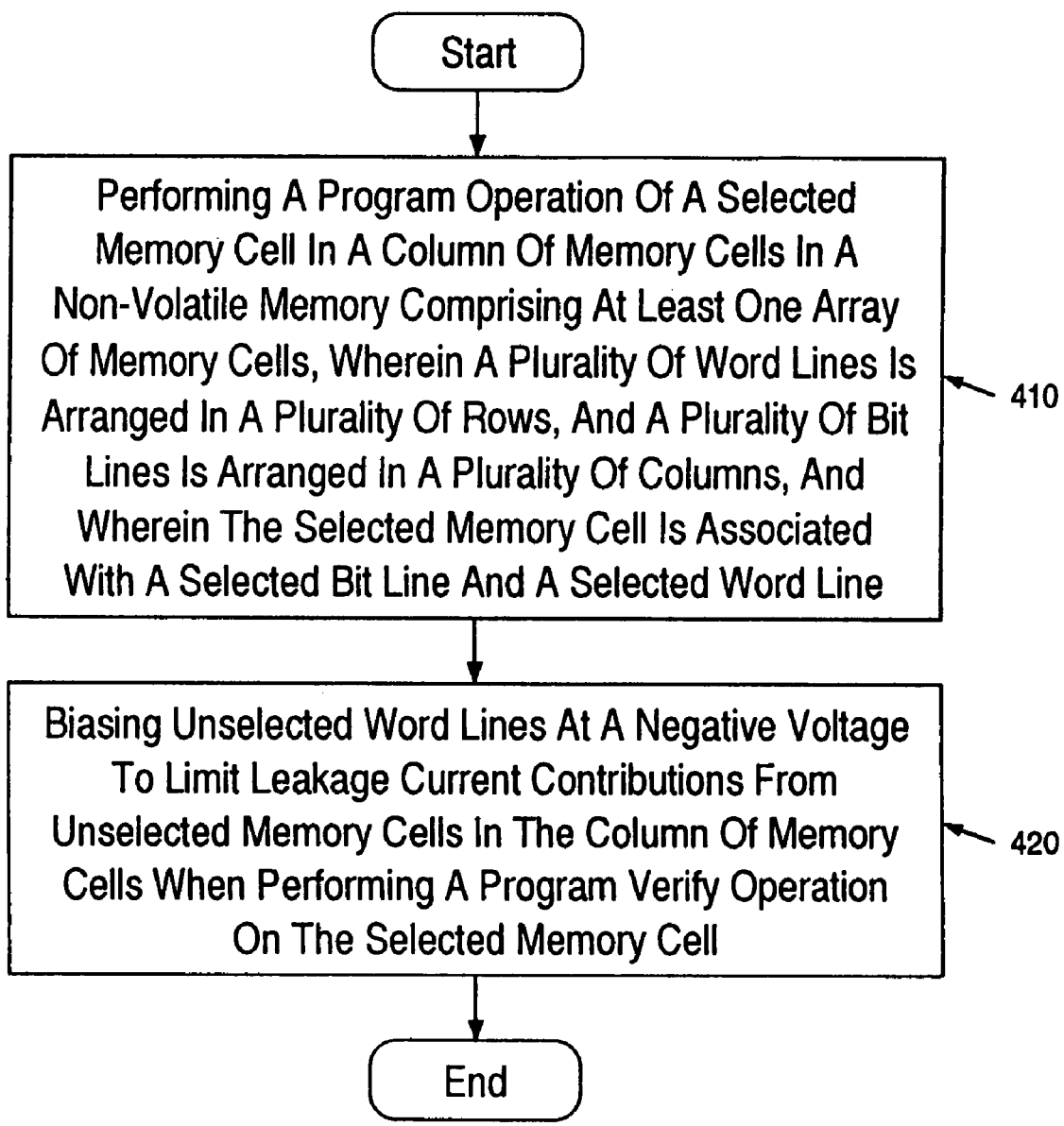
FIG. 4 is a flow chart illustrating steps in a method for minimizing the effect of leakage current when performing a program verify operation, in accordance with one embodiment of the present invention.

Referring now to FIG. 4, a flow chart 400 is disclosed illustrating steps in a method for minimizing leakage current when determining states of memory cells during a program verify operation, in accordance with one embodiment of the present invention. The present embodiment is performed on a selected memory cell that is associated with a column of memory cells in a non-volatile memory. The non-volatile memory comprises at least one array of memory cells, wherein the array comprises a plurality of word lines arranged in a plurality of rows, and a plurality of bit lines arranged in a plurality of columns. Each of the memory cells comprises a source, a control gate coupled to a respective word line, and a drain coupled to a respective bit line, and is capable of storing a respective bit.

At 410, the present embodiment performs a program operation of the selected memory cell in a column of memory cells. The program operation is a soft program operation performed to tighten up the threshold distribution of erased memory cells in an array of memory cells, in one embodiment. In another embodiment, the program operation is a hard program operation performed to program a selected memory cell. That is, the threshold voltage of the selected memory cell is shifted to approximately 6 volts.

During the program verify operation, the present embodiment determines a selected memory cell in a column of memory cells in the array of memory cells. The selected memory cell is associated with a selected word line and a selected bit line. The selected memory cell is also associated with a column of memory cells. In part, by applying the appropriate voltages to the selected word line and the selected bit line, the selected memory cell is isolated to perform a read or write (program) operation.

At 420, the present embodiment biases unselected word lines at a negative voltage to limit leakage current contributions from unselected memory cells in the column of memory cells when performing a program verify operation on the selected memory cell. In this way, when determining whether the selected memory cell is properly programmed, the leakage current from unselected memory cells that are over-erased in the column of memory cells is minimized.

The present embodiment is able to greatly reduce or eliminate false program verify reports during the program verify operation. That is, because the leakage current from unselected memory cells in a column of memory cells is reduced, the contribution of leakage current to the current read from the bit line can be ignored. As such, the current read from the bit line is primarily from the selected memory cell. As a result, the state of the selected memory cell can be determined. For example, if the selected memory cell is properly programmed, the current from the selected memory cell will be below a reference current. Leakage current from unselected memory cells in the column can contribute to the current read from the associated bit line giving a false reading that indicates that the selected memory cell is erased or over-erased. However, because the leakage current can be ignored, the current from the bit line will be contributed solely from the selected memory cell, and will also be below the reference current thereby giving a proper program reading for the selected memory cell. As such, the present embodiment is able to greatly reduce or eliminate false program verify readings.

As described previously, the program operation is a soft program operation, in one embodiment, to tighten up the threshold voltage distribution of the array of memory cells after an erase operation. As such, to determine if over-erasure of the selected memory cell was properly adjusted, the present embodiment performs a soft program verify operation, where the selected word line is biased at approximately 2.6 volts, the selected bit line is biased at approximately 0.65 volts, and the remaining bit lines are floated or biased to ground. As described previously, the unselected word lines are biased at a voltage between the range of −0.5 volts to −2.0 volts.

Also, as described previously, the program operation is a hard program operation, in one embodiment, to program the selected memory cell for storage of data, in one embodiment. As such, to determine if the selected memory cell was properly programmed, the present embodiment performs a hard program verify operation, where the selected word line is biased at approximately 5.2 volts, the selected bit line is biased at approximately 0.65 volts, and the remaining bit lines are floated or biased to ground. As described previously, the unselected word lines are biased at a voltage between the range of −0.5 volts to −2.0 volts.

The preferred embodiment of the present invention, a method for minimizing the effect of leakage current when determining states of memory cells, is thus described. While the present invention has been described in particular embodiments, it should be appreciated that the present invention should not be construed as limited by such embodiments, but rather construed according to the below claims.

What is claimed is:

1. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for minimizing leakage current when detecting states of memory cells comprising:

determining a selected bit line that is associated with a column of memory cells; and biasing a group of word lines at a negative voltage to limit leakage current contributions from associated memory cells in said column of memory cells when performing a verify operation, wherein said memory cells are coupled to said group of word lines, and wherein said negative voltage is selected from a voltage between −0.5 volts to −2.0 volts, wherein said verify operation comprises an erase verify operation comprising:

determining a selected memory cell in said column of memory cells, said selected memory cell associated with said selected bit line, and a selected word line that is not part of said group of word lines; and biasing said selected word line at approximately 3 volts;

biasing said selected bit line at approximately 0.65 volts; and floating remaining bit lines.

2. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for minimizing leakage current when detecting states of memory cells comprising:

determining a selected bit line that is associated with a column of memory cells; and biasing a group of word lines at a negative voltage to limit leakage current contributions from associated memory cells in said column of memory cells when performing a verify operation, wherein said memory cells are coupled to said group of word lines, and wherein said negative voltage is selected from a voltage between −0.5 volts to −2.0 volts, wherein said verify operation comprises an automatic program disturb after erase (APDE) verify operation comprising:

biasing all word lines at said negative voltage when performing an APDE verify operation on said column of memory cells;

biasing said selected bit line at approximately 0.65 volts; and floating remaining bit lines.

3. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for minimizing leakage current when detecting states of memory cells comprising:
  determining a selected bit line that is associated with a column of memory cells; and
  biasing a group of word lines at a negative voltage to limit leakage current contributions from associated memory cells in said column of memory cells when performing a verify operation, wherein said memory cells are coupled to said group of word lines, and wherein said negative voltage is selected from a voltage between −0.5 volts to −2.0 volts, wherein said verify operation comprises a soft program verify operation comprising:
    after performing a soft program operation of a memory cell that is over-erased in said column of memory cells, biasing a selected word line at approximately 2.6 volts, wherein said memory cell is coupled to said selected word line that is not part of said group of word lines;
    biasing said selected bit line at approximately 0.65 volts; and
    floating remaining bit lines.

4. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for minimizing leakage current when detecting states of memory cells comprising:
  determining a selected bit line that is associated with a column of memory cells; and
  biasing a group of word lines at a negative voltage to limit leakage current contributions from associated memory cells in said column of memory cells when performing a verify operation, wherein said memory cells are coupled to said group of word lines, and wherein said negative voltage is selected from a voltage between −0.5 volts to −2.0 volts, wherein said verify operation comprises a program verify operation comprising:
    after performing a program operation of a memory cell in said column of memory cells, biasing a selected word line at approximately 5.2 volts, wherein said memory cell is coupled to said selected word line that is not part of said group of word lines;
    biasing said selected bit line at approximately 0.65 volts; and
    floating remaining bit lines.

5. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for detecting proper erasure of a memory cell comprising:
  determining a selected memory cell in a column of memory cells, said selected memory cell associated with a selected word line and a selected bit line; and
  biasing unselected word lines at a negative voltage to limit leakage current contributions from unselected memory cells in said column of memory cells when performing an erase verify operation on said selected memory cell, wherein said negative voltage is selected from a voltage between −0.5 volts to −2.0 volts;
  selecting another column of memory cells, said another column of memory cells associated with another selected bit line; and
  biasing all word lines at said negative voltage when performing an APDE verify operation on said another column of memory cells.

6. The method of claim 5, further comprising:
  before said determining a selected memory cell, performing an array wide erase operation on said array of memory cells.

7. The method of claim 5, further comprising:
  performing said erase verify operation on each memory cell in said array of memory cells;
  performing another array wide erase operation when a failing memory cell in said array of memory cells is not properly erased and does not pass said erase verify operation; and
  performing said performing said erase verify operation and said performing another array wide erase operation until all memory cells in said array of memory cells are erased.

8. The method of claim 5, wherein said erase verify operation comprises:
  biasing said selected word line at approximately 3 volts;
  biasing said selected bit line at approximately 0.65 volts; and
  floating remaining bit lines.

9. The method of claim 5, further comprising:
  performing said APDE verify operation on each column of memory cells in said array of memory cells;
  performing an APDE operation when a failing memory cell in said array of memory cells does not pass said APDE verify operation and is not properly erased; and
  performing said selecting another column of memory cells and said biasing all word lines at said negative voltage until all memory cells in said array of memory cells are properly erased.

10. The method of claim 5, wherein said APDE verify operation further comprises:
  biasing said another selected bit line at approximately 0.65 volts; and
  floating remaining bit lines.

11. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for detecting proper erasure of a memory cell comprising:
  a) performing a soft program operation of a selected memory cell in a column of memory cells, said selected memory cell associated with a selected bit line and a selected word line, wherein said soft program verify operation comprises:
    biasing said selected word line at approximately 2.6 volts;
    biasing said selected bit line at approximately 0.65 volts; and
    floating remaining bit lines; and
  b) biasing unselected word lines at a negative voltage to limit leakage current contributions from unselected memory cells in said column of memory cells when performing a soft program verify operation on said selected memory cell.

12. The method of claim 11, wherein said selected memory cell is over-erased.

13. The method of claim 11, further comprising:
  before a), performing an array wide erase operation on said array of memory cells.

14. The method of claim 11, wherein said negative voltage is selected from a voltage between −0.5 volts to −2.0 volts.

15. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for detecting proper programming of a memory cell comprising:
 a) performing a program operation of a selected memory cell in a column of memory cells, said selected memory cell associated with a selected bit line and a selected word line;
 b) biasing unselected word lines at a negative voltage to limit leakage current contributions from unselected memory cells in said column of memory cells when performing a program verify operation on said selected memory cell, wherein said negative voltage is selected from a voltage between −0.5 volts to −2.0 volts, wherein said program verify operation comprises:
  biasing said selected word line at approximately 5.2 volts;
  biasing said selected bit line at approximately 0.65 volts; and
  floating remaining bit lines.

16. In a non-volatile memory comprising at least one array of memory cells, a plurality of word lines arranged in a plurality of rows, a plurality of bit lines arranged in a plurality of columns, each of the memory cells comprising a source, a control gate coupled to a respective word line, and a drain coupled to a respective bit line, and capable of storing a respective bit, a method for detecting proper erasure of a memory cell comprising:
 a) determining a selected memory cell in a column of memory cells, said selected memory cell associated with a selected word line and a selected bit line;
 b) biasing unselected word lines at a negative voltage to limit leakage current contributions from unselected memory cells in said column of memory cells when performing an erase verify operation on said selected memory cell;
 c) selecting another column of memory cells, said another column of memory cells associated with another selected bit line; and
 d) biasing all word lines at said negative voltage when performing an APDE verify operation on said another column of memory cells, wherein said APDE verify operation further comprises:
  e) biasing said another selected bit line at approximately 0.65 volts; and
  f) floating remaining bit lines.

17. The method of claim 16,
further comprising
 e) performing said APDE verify operation on each column of memory cells in said array of memory cells;
 f) performing an APDE operation when a failing memory cell in said array of memory cells does not pass said APDE verify operation and is not properly erased; and
 g) performing c) and d) until all memory cells in said array of memory cells are properly erased.

* * * * *